(12) United States Patent
Boduch et al.

(10) Patent No.: US 10,658,211 B2
(45) Date of Patent: May 19, 2020

(54) DATA STRUCTURES FOR SEMICONDUCTOR DIE PACKAGING

(71) Applicant: TEXAS INSTRUMENTS INCORPORATED, Dallas, TX (US)

(72) Inventors: Joseph Anthony Boduch, Frisco, TX (US); Sandia You Ni Chiu, Allen, TX (US); Robert Daniel Orr, Allen, TX (US); Michael Francis Pas, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/057,598

(22) Filed: Aug. 7, 2018

(65) Prior Publication Data

US 2018/0350645 A1 Dec. 6, 2018

Related U.S. Application Data

(62) Division of application No. 15/492,765, filed on Apr. 20, 2017, now Pat. No. 10,068,786.

(51) Int. Cl.
*H01L 21/00* (2006.01)
*H01L 21/67* (2006.01)
*H01L 21/56* (2006.01)
*H01L 21/66* (2006.01)
*H01L 23/544* (2006.01)
(Continued)

(52) U.S. Cl.
CPC .... *H01L 21/67288* (2013.01); *H01L 21/4825* (2013.01); *H01L 21/565* (2013.01); *H01L 22/20* (2013.01); *H01L 23/544* (2013.01); *H01L 21/67144* (2013.01); *H01L 22/14* (2013.01); *H01L 23/495* (2013.01); *H01L 2223/54413* (2013.01); *H01L 2223/54486* (2013.01)

(58) Field of Classification Search
CPC ............. H01L 21/67288; H01L 21/565; H01L 21/4825; H01L 21/67144; H01L 22/20; H01L 23/544; H01L 23/495
See application file for complete search history.

(56) References Cited

U.S. PATENT DOCUMENTS

| 5,615,219 | A | 3/1997 | Keating et al. |
| 10,068,786 | B1 * | 9/2018 | Boduch ................ H01L 23/544 |
| 2002/0017708 | A1 | 2/2002 | Takagi et al. |

OTHER PUBLICATIONS

SEMI International Standards, Step: E142 Substrate Mapping and Device Traceability, Semicon West 2005, San Francisco, CA, Jul. 12, 2005.

(Continued)

*Primary Examiner* — Richard A Booth
(74) *Attorney, Agent, or Firm* — Ronald O. Neerings; Charles A. Brill; Frank D. Cimino

(57) ABSTRACT

At least some embodiments are directed to a system that comprises storage comprising a data structure that cross-references an identifier of a semiconductor wafer, a location of a die in the wafer, an identifier of a lead frame strip, a location of a lead frame in the lead frame strip, and results of a first test on the die. The system also comprises mechanical equipment configured to test packaged die. The system further comprises a processor, coupled to the storage and to the mechanical equipment, configured to perform a second test on a package containing the die and the lead frame using the mechanical equipment and the results of the first test.

26 Claims, 5 Drawing Sheets

(51) Int. Cl.
*H01L 21/48* (2006.01)
*H01L 23/495* (2006.01)

(56) References Cited

OTHER PUBLICATIONS

Semi E142.Jan. 0706, XML Schema for Substrate Mapping, Semi 2005, 2006, pp. 1-7.
Semi E142-0706, Specification for Substrate Mapping, Semi 2005, 2006, pp. 1-27.

* cited by examiner

| 402 LEAD FRAME LOT NUMBER | 404 LEAD FRAME STRIP ID | 406 LEAD FRAME X, Y | 408 WAFER LOT NUMBER | 410 WAFER ID | 412 WAFER X, Y | 414 FIRST TEST INFORMATION | 416 FINAL TEST INFORMATION | 418 DEFECT/ MISCELLANEOUS INFORMATION |
|---|---|---|---|---|---|---|---|---|
| 3D22X | 5661224 | 3, 4 | 4N223 | 13 | 20, 11 | 2.7125 GHz | PASS | NONE |
| 3D22X | 5661224 | 3, 4 | 46Z55 | 6 | 18, 10 | 2.6311 GHz | PASS | NONE |
| | | | | | | | | |
| | | | | | | | | |
| | | | | | | | | |

FIG. 4

DATA STRUCTURES FOR SEMICONDUCTOR DIE PACKAGING

This application is a Divisional of application Ser. No. 15/491,765 filed Apr. 20, 2017.

BACKGROUND

A semiconductor wafer may be singulated into several distinct components, with each component constituting a separate die on which a circuit is fabricated. A completed die may be attached to a lead frame—for instance, to a die flag forming part of the lead frame. Various types of electrical connections may then be established between the die, the lead frame and, possibly, other components. The assembly may then be molded to produce a package, and the lead frame—if it is part of a lead frame strip—may be trimmed to produce a standalone package.

SUMMARY

At least some embodiments are directed to a system that comprises storage comprising a data structure that cross-references an identifier of a semiconductor wafer, a location of a die in the wafer, an identifier of a lead frame strip, a location of a lead frame in the lead frame strip, and results of a first test on the die. The system also comprises mechanical equipment configured to test packaged die. The system further comprises a processor, coupled to the storage and to the mechanical equipment, configured to perform a second test on a package containing the die and the lead frame using the mechanical equipment and the results of the first test.

At least some embodiments are directed to a system, comprising a wafer singulation tool to cingulate a semiconductor wafer and to produce a die, a first testing tool to perform a first test on the die, a die attach tool to remove the die from the singulated wafer and to attach the die to a lead frame of a lead frame strip, and packaging equipment to produce a package housing the die and the lead frame. The system also comprises a second testing tool to perform a second test on the package, and a data structure that cross-references an identifier of the wafer, a location of the die in the wafer, an identifier of the lead frame strip, a location of the lead frame in the lead frame strip, data from the first test, and data from the second test.

At least some embodiments are directed to a method, comprising performing a test on a die from a singulated semiconductor wafer, determining that the die passes the test, populating a data structure with an identifier of the wafer and a location of the die in the wafer, and as a result of the determination that the die passes the test, removing the die from the wafer and attaching the die to a lead frame. The lead frame is part of a lead frame strip. The method also comprises populating the data structure with an identifier of the lead frame strip and a location of the lead frame in the lead frame strip. The data structure cross-references the identifier of the wafer and the location of the die in the wafer with the identifier of the lead frame strip and the location of the lead frame in the lead frame strip.

BRIEF DESCRIPTION OF THE DRAWINGS

For a detailed description of various examples, reference will now be made to the accompanying drawings in which:

FIG. 4 shows an illustrative mapping data structure.

DETAILED DESCRIPTION

Figure 1:
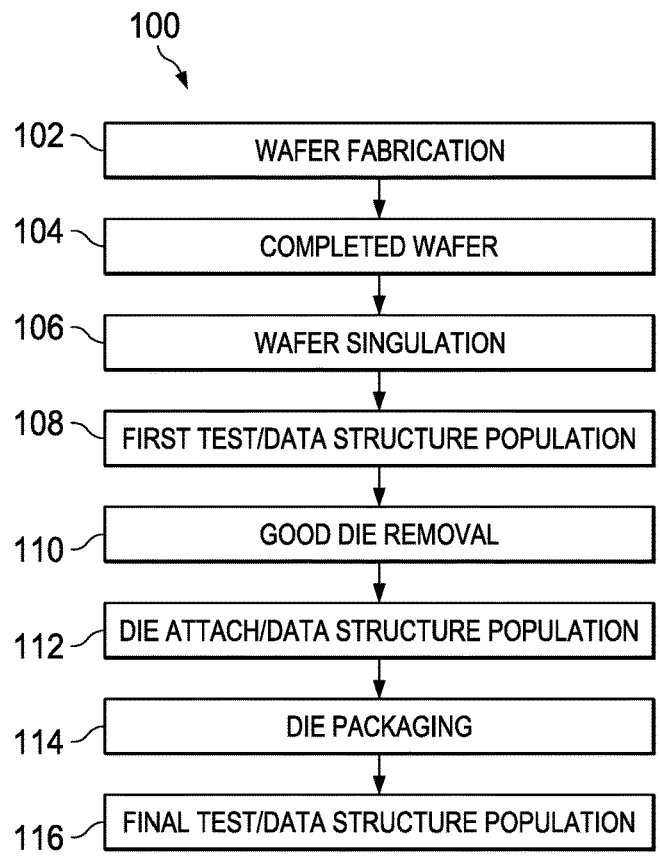
FIG. 1 is a block diagram of an illustrative semiconductor die packaging flow.

Packages produced using the general process described above may fail after being deployed in the field. Such failures are frequently due to defective chips (i.e., die), and such die defects are often due to problems in the wafer manufacturing process or equipment. The ability to identify the wafer or wafer lot from which a defective die was produced may be helpful in identifying wafer manufacturing processes and equipment that cause such defects. However, there appears to be no way to readily identify the wafer or wafer lot from which a die was produced.

At least some embodiments are directed to die packaging systems and methods in which dies from singulated wafers are tested, picked-and-placed into lead frames, electrically coupled to the lead frames and potentially other components in the lead frames, and molded to produce a package. The disclosed systems and methods include mapping data structures that may cross-reference various types of information pertaining to the die packaging process flow, such as and without limitation: semiconductor wafer lot numbers; wafer identifiers; locations (e.g., coordinates) of packaged dies before the dies were removed from their respective wafers; locations (e.g., coordinates) of lead frames relative to the lead frame strips to which the lead frames belong; lead frame strip identifiers; defects identified during the packaging process; and the results of one or more tests performed during the packaging process. The data structure may be referred to as a "mapping" data structure because the data structure, in at least some embodiments, is populated with data from various stages of the packaging process, thus "mapping" the stages of the packaging process to each other.

A mapping data structure may be used at various points during the packaging process—for instance, the mapping data structure may be populated with the results of a wafer-stage probe test, and these test results may be used during a subsequent test to enhance the accuracy or efficiency of the subsequent test. Mapping data structures also may be used to generate wafer maps that identify all dies removed from a particular wafer and whether any of those dies were later found to be defective. Such wafer maps may be useful in identifying areas of wafers that tend to be disproportionately affected with defects, which may, in turn, be used to identify defects in wafer fabrication processes or equipment. In addition, such mapping data structures may be used to trace the origin of a defective die after the die has been packaged. For example, if a package deployed in the field fails, the data structure—or an aggregate of such data structures—may be consulted to identify the wafer from which the die was removed. Packages may be marked with identifiers to facilitate reference to one or more mapping data structures containing information regarding the package(s). Multiple instances of field failures from wafers that share some commonality, such as a common manufacturing facility, may prompt further investigation to identify and remedy the problem. The foregoing instances are merely illustrative and do not limit the scope of this disclosure. The disclosed mapping data structures may be populated with any and all suitable types of information during the die packaging process and such data structures may be leveraged in any suitable manner during or after the packaging process is complete. Thus, such mapping data structures present multiple technical advantages, including improvements in efficiency during the die packaging process (e.g., by passing updated mapping data structures between various tools performing different parts of the die packaging process) and the expeditious identification and correction of defects in wafer manufacturing processes and equipment (e.g., by using mapping data structures to trace the origins of defective dies back to the wafers or wafer lots from which the defective dies were extracted).

FIG. 1 is a block diagram of a semiconductor die packaging flow 100, which may include various steps and systems for performing such steps. The flow 100 is illustrative and is not intended to be an exhaustive depiction of every operation that may be performed during a die packaging flow. Steps and systems may be added or removed from the flow 100 as desired and as may be appropriate. The scope of disclosure includes any and all such modifications to the flow 100. The illustrative flow 100 may include a wafer fabrication stage 102 in which a plain semiconductor wafer is processed to produce a plurality of circuits on the wafer. The completed wafer (numeral 104) may then be singulated—for instance, using a conventional wafer singulation tool, such as a wafer saw (numeral 106).

The flow 100 may further comprise a first testing stage 108 during which a testing tool may be used to test the dies of the singulated wafer. Such a first test may comprise a probe test. Various aspects of the dies may be tested during the first test, such as a reference current, voltage, frequency, or a condition used to achieve any of these values. The system or tool that performs this first test may be configured to record the results of the test, parameters pertaining to the test (e.g., testing conditions, such as signal frequency used, ambient temperature of wafer during testing), and any other relevant data in a mapping data structure (numeral 108). The flow 100 may further include lifting the "good" die(s)—that is, the die(s) that pass the first test—and attaching those dies to lead frames (numerals 110 and 112). Such a pick-and-place process may be performed by, e.g., a die attach tool (DAT). The DAT also may populate the mapping data structure, received from the system or toot that performed the first test in stage 108, with data collected during the pick-and-place process. For example and without limitation, the DAT may populate the mapping data structure with the lot number of the wafer from which the die in question is removed; an identifier (e.g., an identification code) of the wafer from which the die in question is removed; a location (e.g., coordinates) of the die in the wafer prior to removal from the wafer; a lot number of the lead frame to which the die is attached; an identifier of the lead frame to which the die is attached; and a location (e.g., coordinates) of the lead frame in the lead frame strip. The DAT may have access to the wafer lot number, the wafer identifier, and the location of the die in the wafer because it is typically programmed with such information prior to extraction of the die from the wafer so that the DAT may extract the die from the wafer. In addition, the DAT may have access to the location of the lead frame relative to the lead frame strip because it may record the location of the lead frame into which it attaches the die. For instance, the DAT may be programmed to attach dies into lead frames in a sequential manner, so the DAT may place a first die in a lead frame with coordinates (1, 1) and a second die in a lead frame on the same strip but with coordinates (1, 2), and so forth. Each time a die is placed in a lead frame, the DAT may record the coordinates of that lead frame in the entry or entries of the data structure that correspond to the die that was placed in that lead frame. Further, the DAT may obtain the lead frame strip lot numbers and identifiers by scanning a scannable bar code that appears on the lead frame strip. For example, the scannable bar code may be laser-inscribed on the lead frame strip. In some embodiments, the scannable bar code appears in multiple locations on the lead frame strip and in multiple orientations to accommodate different orientations of various tools in the die packaging process that may require access to the scannable bar code.

The flow 100 may further include completing the remaining steps of the die packaging process (numeral 114), such as and without limitation, wire bonding, inspection, molding, trimming the lead frame, etc. Defects identified during these steps also may be manually (e.g., by a human using a computer with access to the mapping data structure) or automatically (e.g., at the direction of a computer with access to the mapping data structure) recorded in the mapping data structure. A final test may then be performed using an appropriate testing tool (numeral 116). Various aspects of the completed package may be tested—for example, using previously determined values to establish operating or test conditions for the completed package, or to determine changes in performance of the completed package. The testing tool may use the mapping data structure to perform some or all of the final test. For example, if, during a prior test (e.g., the initial test in numeral 108 or another test during the process 100), a particular parameter, such as an operational amplifier gain setting, is tested under a particular temperature condition, the same parameter may be tested under a different temperature condition at final test. The results may then be compared and used to, e.g., trim the circuit on the die. In some embodiments, prior testing results recorded in the mapping data structure may mean that one or more steps in the final test (numeral 116) can be omitted as redundant, thus increasing testing efficiency.

As previously explained, the depiction in FIG. 1 and the foregoing description of the process 100 are not intended to be exhaustive. Various steps may be added to the process 100, including multiple other testing stages in addition to the initial and final tests represented by numerals 108 and 116, respectively.

Figure 2:
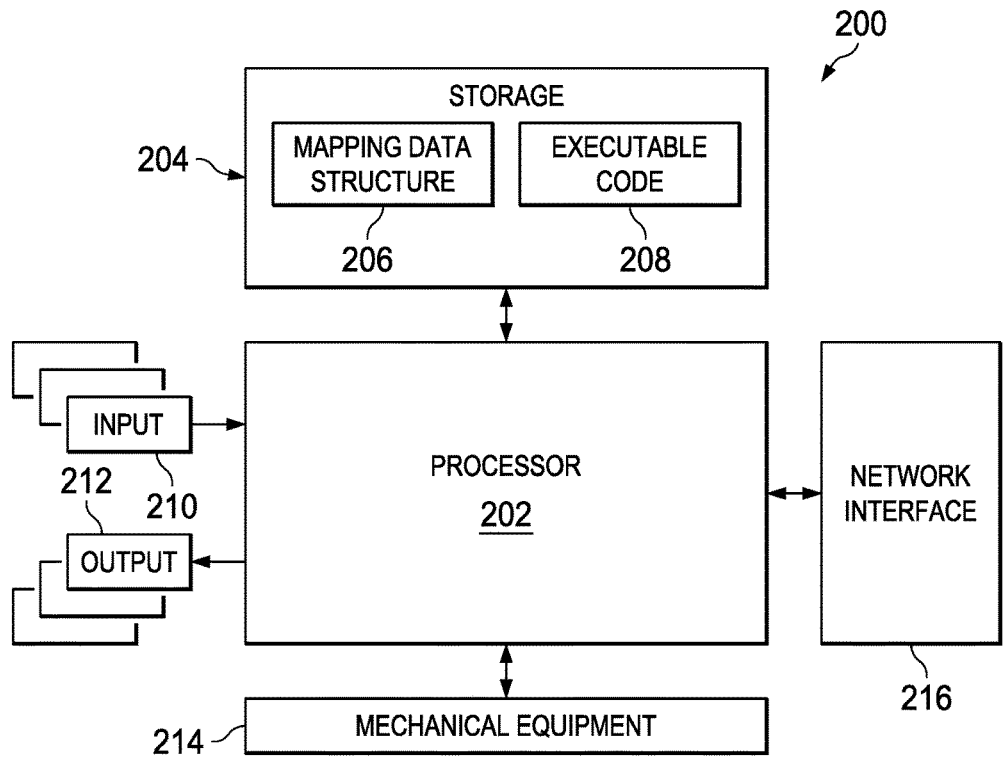
FIG. 2 is a block diagram of an illustrative testing tool and of an illustrative die attach tool.

FIG. 2 is a block diagram of a system 200. The system 200 is illustrative of the testing tool that may be used in the first test stage 108 of FIG. 1. The system 200 is also representative of the die attach tool (DAT) that may be used in the good die removal and attach stages 110 and 112 of FIG. 1. The system 200 may comprise a processor 202; storage 204 (e.g., random access memory, read-only memory) storing a mapping data structure 206 and executable code 208; one or more input devices 210 (e.g., keyboard, mouse, touchscreen, optical barcode scanning technology); one or more output devices 212 (e.g., display); mechanical equipment 214, such as a mechanical arm or arms, that may be used to grasp and move objects, to perform the physical aspects of tests, and to remove dies from wafers and attach dies to lead frames; and a network interface 216 via which the processor 202 may communicate with other computers or systems through a network—for example, to transmit and/or receive copies of the most current version of the mapping data structure 206. As a result of executing the executable code 208, the processor 202 may perform some or all of the actions attributed herein to the processor 202 and/or the system 200.

As mentioned above, the system 200 is illustrative of the testing tool that may be used in the first test stage 108 of the process 100 of FIG. 1. In this role, the processor 202 may use the mechanical equipment 214 to perform the test—for instance, to apply one or more probes to the die being tested. As it tests the die, the processor 202 may collect test parameters and/or test results and may record them in the mapping data structure 206. Examples of such parameters and results are provided above and, thus, are not repeated here. In some embodiments, the processor 202 records test results and/or parameters for all dies tested. In some embodiments, the processor 202 records test results and/or parameters for only good dies (i.e., dies passing the first test 108).

As also mentioned, the system 200 is illustrative of the DAT used in stages 110 and 112 of the process 100 of FIG. 1. In this role, the processor 202 may use the mechanical equipment 214 to remove good dies from a wafer and to attach the good dies to lead frames. The processor 202 may use the most recent version of the mapping data structure 206 to identify the good dies—for instance, based on the test results recorded in the data structure 206. For each die removed from a respective wafer and attached to a lead frame of a lead frame strip, the processor 202 may record any and all relevant information. Examples of such information may include, without limitation, the lot number of the wafer from which the good die is removed; an identifier of the wafer from which the good die is removed; an x-y coordinate of the good die relative to the wafer from which the good die is removed; a lot number of the lead frame strip containing the lead frame into which the good die is attached; an identifier of the lead frame strip (e.g., based on a scannable barcode imprinted on the lead frame strip); and an x-y coordinate of the lead frame receiving the die relative to the lead frame strip to which the lead frame belongs. In some cases, multiple dies may be attached to a single lead frame, and in such cases, relevant, additional information may be recorded in the data structure 206 as appropriate. In such cases, relevant information may be recorded in a single entry (e.g., with a single lead frame being cross-referenced with both good dies) or may be distributed across multiple entries (e.g., with a first entry for a first good die and a second entry for a second good die, each of the two entries cross-referencing a single lead frame).

Information recorded in the mapping data structure 206 at any stage of the process 100 (FIG. 1) may be recorded such that the information is cross-referenced only with relevant, other information. For example, in at least some embodiments, a lead frame strip identifier should not be cross-referenced with a wafer identifier if no die from that wafer is attached to a lead frame from that lead frame strip.

Figure 3:
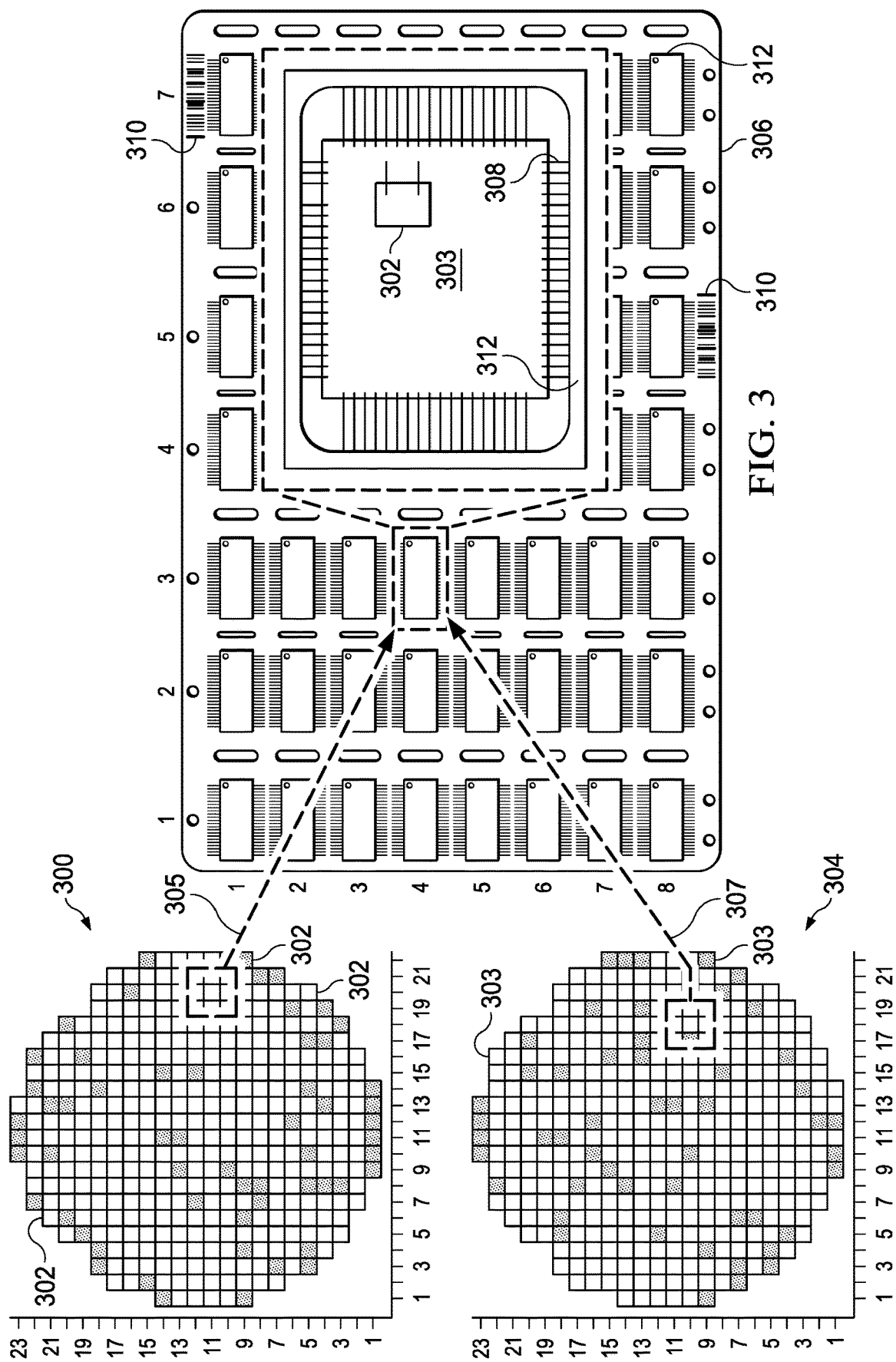
FIG. 3 is a schematic diagram of an illustrative pick-and-place process for removing dies from singulated wafers and attaching the dies to lead frames.

FIG. 3 is a schematic diagram of an illustrative pick-and-place process for removing good dies from singulated wafers and attaching the good dies to lead frames. The diagram depicts a singulated wafer 300, a singulated wafer 304, and a lead frame strip 306. The wafer 300 may comprise multiple dies 302, as shown. The non-shaded dies 302 may represent good dies, and the shaded dies 302 may represent bad dies (e.g., dies that failed the first test 108, FIG. 1). Each of the dies 302 in the wafer 300 may be referenced based on its location in the wafer 300 using a coordinate system. As shown, the x-axis for the wafer 300 is numbered from 1 to 22, and the y-axis is numbered from 1 to 23. Similarly, the wafer 304 may comprise multiple dies 303, with the non-shaded dies 303 possibly representing good dies and the shaded dies 303 possibly representing bad dies. The location of each die 303 in the wafer 304 may be specified using x-y coordinates, with the x-axis being numbered from 1 to 22 and the y-axis being numbered from 1 to 23. The lead frame strip 306 may include multiple lead frames 312. An x-y coordinate system may be used to specify the location of each lead frame 312, with the x-axis being numbered from 1 to 7 and the y-axis being numbered from 1 to 8. The coordinate systems depicted in FIG. 3 are illustrative and non-limiting. The lead frame strip 306 may additionally include multiple instances of a scannable bar code 310, which may uniquely identify the lead frame strip 306.

A DAT, such as that depicted in FIG. 2, may remove a good die 302 from the wafer 300 and attach the good die 302 to a lead frame 312. Similarly, in this illustration, the DAT may remove a good die 303 from the wafer 304 and attach the good die 303 to the same lead frame 312 as the good die 302. As numeral 305 indicates, the good die 302 that is removed from the wafer 300 in this example is located at coordinate (20, 11), As numeral 307 indicates, the good die 303 that is removed from the wafer 304 in this example is located at coordinate (18, 10). Both of these good dies are attached to the lead frame 312 that is located at coordinate (3, 4) on the lead frame strip 306. In this illustration, the good die 303 is physically larger than the good die 302. Accordingly, the good die 303 is coupled to a die flag (not visible in FIG. 3) of the lead frame 312 and the good die 302 is mounted on the good die 303. Various electrical connections may subsequently be established, such as by wire bonds 308. During this process of removing dies from wafers and attaching the dies to a lead frame, the DAT may record various data—such as that described above—in the mapping data structure. FIG. 4 shows an illustrative mapping data structure 206, part of which may be populated by the DAT as the DAT removes dies from wafers and attaches them to lead frames. As shown in FIG. 4, the mapping data structure 206 includes columns 402, 404, 406, 408, 410, 412, 414, 416, and 418, which describe lead frame lot number, lead frame strip identifier, lead frame x-y coordinate, wafer lot number, wafer identifier, wafer x-y coordinate, first test information, final test information, and defect/miscellaneous information, respectively.

Entries 422 and 424 both correspond to the same lead frame 312 depicted in FIG. 3, but they correspond to different good dies 302, 303, as depicted in FIG. 3. Referring to both FIGS. 3 and 4, the entry 422 specifies the lead frame lot number 3D22X in column 402, which may refer to the lot number of the lead frame 306 in FIG. 3. This lot number may be obtained, for instance, from the scannable bar code 310. The entry 422 next specifies a lead frame strip identifier in column 404, which in this case is illustratively depicted as 5661224 and may be obtained from the scannable bar code 310. The entry 422 next specifies a lead frame x-y coordinate in column 406. In this case, the lead frame 312 into which the good dies are placed is located at coordinate (3, 4), as shown in FIG. 3. The entry 422 also specifies a wafer lot number in column 408, which, in this example, is 4N223. The entry 422 specifies a wafer identifier and coordinate in columns 410 and 412, which are illustratively provided as 13 and (20, 11), respectively. As explained above, the DAT may be programmed with some or all of the values in columns 408, 410, and 412. The entry 422 may further include additional testing information as desired—in this example, a frequency of a signal (2.7125 GHz) used to test the good die at the first test 108 (FIG. 1), as shown in column 414, and an overall test result of the final test 116 (FIG. 1), as shown in column 416. The information in column 414 may be recorded in the data structure 206 by the testing tool that performs the first test 108, and the information in column 416 may be recorded by the testing tool that performs the final test 116. Any other relevant information may be recorded in column 418, such as defects that may have been identified in other parts of the die packaging process (e.g., wire bonding, molding, lead frame trimming). Such information in column 418 may be recorded by any suitable tool(s) during the die packaging process 100 (FIG. 1). The entry 424 is identical to the entry 422 with respect to columns 402, 404, and 406, since both entries correspond to the same lead frame and lead frame strip. However, because each of the entries corresponds to a different die (i.e., good die 302 vs. good die 304), the data values in the remaining columns may be different. The scope of disclosure is not limited to the illustrative data structure 206 depicted in FIG. 4. Columns may be added or removed as desired. Information may be recorded in different formats—for instance, numerical, alphabetical, alphanumeric, symbolic, or any other format as desired. The mapping data structure 206 may contain any suitable number of entries and columns, and the entries and columns may be structured in any suitable manner. In some embodiments, the mapping data structure 206 is structured in a manner entirely different than that depicted in FIG. 4.

Figure 5A:
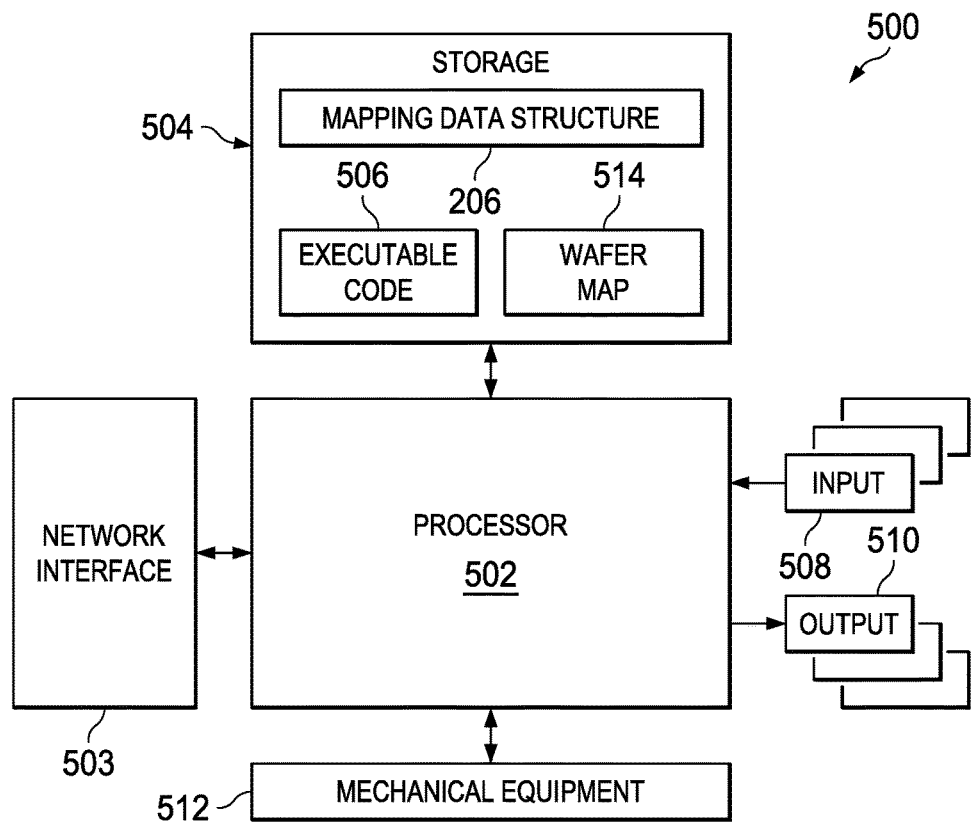
FIG. 5A is a block diagram of another illustrative testing tool.

FIG. 5A is a block diagram of another illustrative testing tool 500. The testing tool 500 may be used, for instance, during the final test 116 (FIG. 1). The tool 500 may comprise a processor 502; a network interface 503; storage 504 (e.g., random access memory, read-only memory) storing the mapping data structure 206, executable code 506, and a wafer map 514; one or more input devices 508 (e.g., keyboard, mouse, touchscreen, optical barcode scanning technology); one or more output devices 510 (e.g., display); and mechanical equipment 512 (e.g., a mechanical arm to perform physical aspects of the final test 116). Executing the executable code 506 causes the processor 502 to perform some or all of the actions attributed herein to the processor 502 and/or the tool 500. The processor 502 may transmit or receive copies of the mapping data structure 206 via the network interface 503, which, like the network interface 216 of FIG. 2, may communicate with other computers via the Internet, via a private network, etc. The processor 502 may use the mechanical equipment 512 and/or the mapping data structure 206 to perform the final test and may record the results of the final test into the mapping data structure 206—for example and without limitation, in columns 416 and/or 418 in FIG. 4. For example, as described above, the tool 500 may use parameters and testing conditions—such as signal frequencies for probe tests, gain parameters, temperatures, and so on—from a prior test as recorded in the mapping data structure 206 to perform the final test, and the results of the final test may be recorded in the mapping data structure 206. In some embodiments, at least some of the same parameters that were tested during the first test may be re-tested during the final test. Illustrative parameters tested during the final test may include reference voltage, output voltage, current capability, gain settings, shut-down features, and timing settings. Conditions that were used to test some such parameters during the first test may be provided to final testing tool so that similar (or different) conditions may be implemented during the final test when testing the same parameters. Although FIG. 4 depicts an illustrative data structure in which results from the final test occupies only a single column 416, in some embodiments, any number of columns, rows, or other structures may be used to accommodate any number and any variety of final test results.

The processor 502 may additionally generate a wafer map 514 using the mapping data structure 206. The wafer map 514 may comprise a visual depiction of a singulated wafer, with different dies in the wafer rendered in different ways depending on the data available regarding each die in the mapping data structure 206 and/or final test results for that die. For example, if the mapping data structure 206 indicates that certain dies from a wafer are bad dies, the wafer map 514 may shade those dies with a certain color. If the mapping data structure 208 omits certain dies from a wafer, it may be assumed that those dies are missing from the data structure because they were not removed from the wafer and thus were bad dies, and so those dies also may be represented with certain colors in the wafer map 514. If the mapping data structure 206 indicates that final test results corresponding to a particular die were poor, the wafer map 514 may depict those dies as shaded with a particular hatching or cross-hatching. Variations on such shading and coloring techniques are contemplated and fall within the scope of this disclosure. A legend may be provided with the wafer map 514 to clarify the meanings of such shades, colors, and other die status depiction techniques. The foregoing examples are merely illustrative and non-limiting. A wafer map representing some or all contents of the mapping data structure 206 and any other relevant information may be depicted in any suitable manner.

Figure 5B:
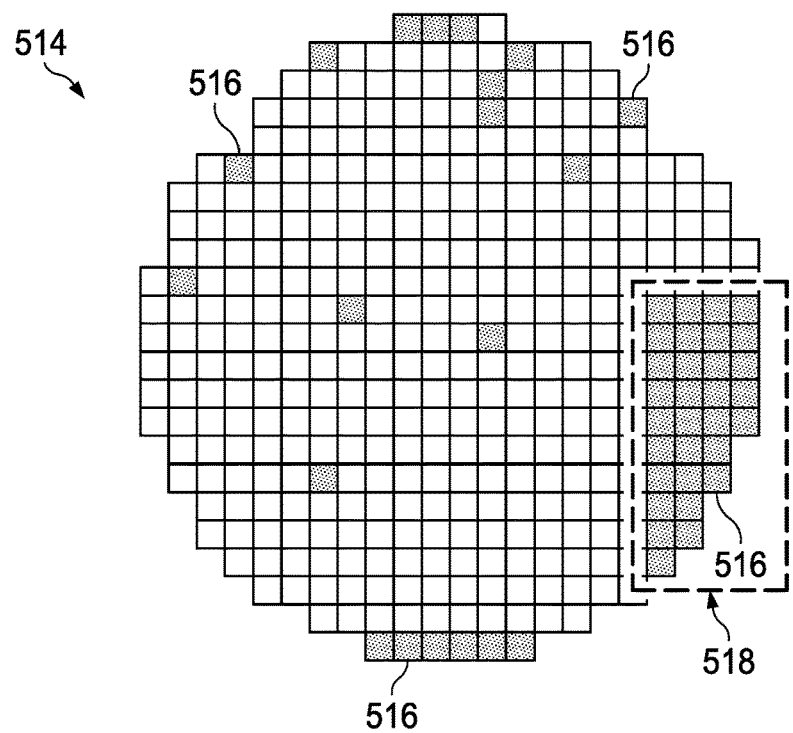
FIG. 5B depicts an illustrative wafer map.

FIG. 5B illustrates an example wafer map 514. The illustrative wafer map 514 may comprise various dies, including defective (or "bad") dies 516. Although most of the bad dies 516 are located diffusely across the wafer map 514, the numeral 518 indicates a cluster of bad dies 516 that may indicate a problem in the fabrication of the wafer—for example, in manufacturing equipment used to manufacture the wafer. Wafer maps for other wafers manufactured with the same equipment may be compared to the wafer map 514 to corroborate such suspicions regarding defective manufacturing equipment and corrective action may be taken as appropriate.

Figure 6:
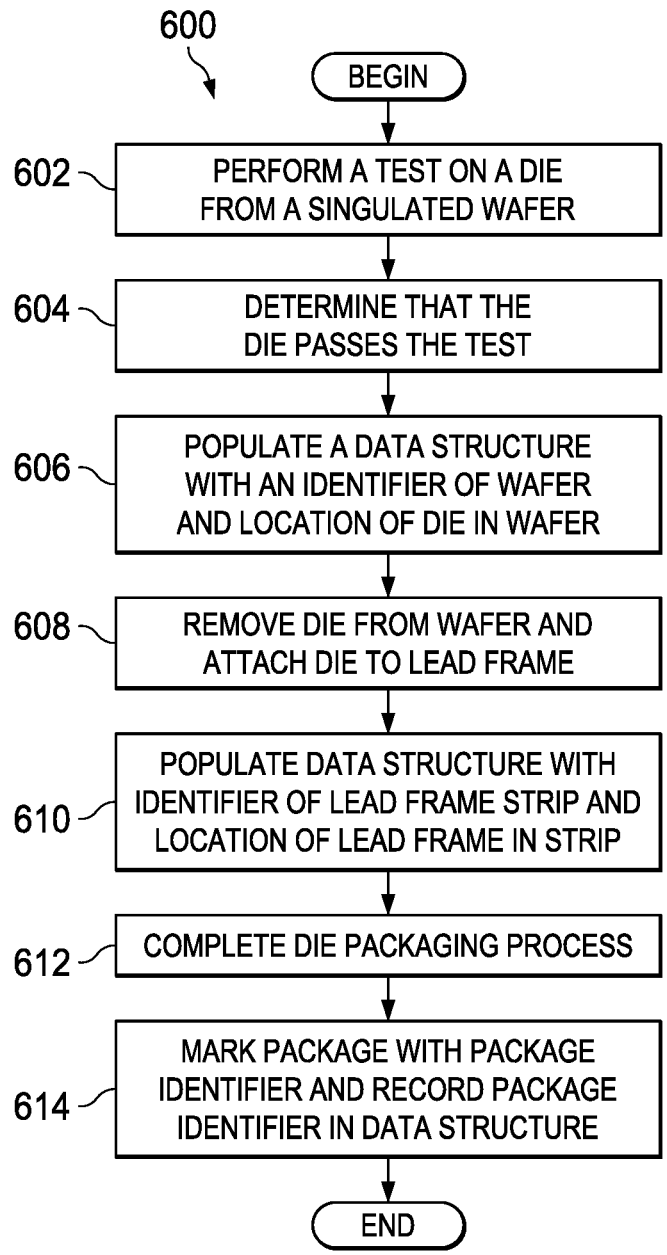
FIG. 6 is a flow diagram of an illustrative method.

FIG. 6 is a flow diagram of an illustrative method 600. The method 600 comprises performing a first test on a die from a singulated wafer (step 602) and determining that the die passes the test (step 604). The first test may be any of the test types described above, or it may be a different type of test. The method 600 also comprises populating a data structure with a wafer identifier and a location of the die in the wafer (step 606). The data structure may be generated using any suitable technique—for example, by creating a multi-dimensional array and populating the multi-dimensional array as shown in and explained with respect to FIG. 4. The method 600 may further comprise removing the die from the wafer and attaching the die to a lead frame (step 608). The method 800 may also include populating the data structure with an identifier of the lead frame strip and a location of the lead frame in the strip (step 610). After the die packaging process is complete (e.g., including the addition of electrical connections, molding, etc.) (step 612), the method 600 may include marking the package—for instance, on an exterior surface of the package—with a package identifier and recording the package identifier in the mapping data structure such that the package identifier is cross-referenced with other, relevant data in the data structure (e.g., lead frame strip identifier and lead frame lot number corresponding to the lead frame housed within the package; wafer lot number and wafer identifier corresponding to a die housed within the package) (step 614). The steps of the method 600 may be performed in any suitable order. Any of the techniques described above may be included as part of the method 600. The method 600 may be adjusted as desired, including by adding, deleting, modifying, or rearranging one or more steps.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system, comprising:
   storage comprising a data structure that cross-references an identifier of a semiconductor wafer, a location of a die in the wafer, an identifier of a lead frame strip, a location of a lead frame in the lead frame strip, and results of a first test on the die;
   mechanical equipment configured to test packaged die; and
   a processor, coupled to the storage and to the mechanical equipment, configured to perform a second test on a package containing the die and the lead frame using the mechanical equipment and the results of the first test.

2. The system of claim 1, wherein the processor is further configured to populate the data structure with results of the second test.

3. The system of claim 1, wherein the data structure is further populated with a lot number of the wafer and a lot number of the lead frame strip.

4. The system of claim 1, wherein the data structure is further populated with defect data collected during packaging of the die and the lead frame.

5. The system of claim 1, wherein the processor is configured to generate a wafer map based on at least one of the data structure and results of the second test, the wafer map specifies areas of the wafer with one or more defects.

6. A system, comprising:
   a wafer singulation tool to singulate a semiconductor wafer and to produce a die;
   a first testing tool to perform a first test on the die;
   a die attach tool to remove the die from the singulated wafer and to attach the die to a lead frame of a lead frame strip;
   packaging equipment to produce a package housing the die and the lead frame;
   a second testing tool to perform a second test on the package; and
   a data structure that cross-references an identifier of the wafer, a location of the die in the wafer, an identifier of the lead frame strip, a location of the lead frame in the lead frame strip, data from the first test, and data from the second test.

7. The system of claim 6, further comprising a processor configured to generate a wafer map using the data structure, the wafer map specifies areas of the wafer with one or more defects.

8. The system of claim 6, wherein the lead frame strip comprises multiple instances of a scannable bar code, and wherein the data structure is populated with the identifier of the lead frame strip using the scannable bar code.

9. The system of claim 6, wherein the data structure comprises a lot number of the wafer and a lot number of the lead frame strip.

10. The system of claim 6, wherein the data structure cross-references the identifier of the lead frame strip and the location of the lead frame in the lead frame strip with an identifier of another wafer from which another die is produced, the another die attached to the lead frame and housed within the package.

11. A system, comprising:
    means for cross-references an identifier of a semiconductor wafer, a location of a die in the wafer, an identifier of a lead frame strip, a location of a lead frame in the lead frame strip, and results of a first test on the die;
    means for testing packaged die; and
    means for performing a second test on a package containing the die and the lead frame using the mechanical equipment and the results of the first test.

12. A system, comprising:
    means for singulating a semiconductor wafer and to produce a die;
    means for performing a first test on the die;
    means for removing the die from the singulated wafer and to attach the die to a lead frame of a lead frame strip;
    means for producing a package housing the die and the lead frame;
    means for performing a second test on the package; and
    means for cross-referencing an identifier of the wafer, a location of the die in the wafer, an identifier of the lead frame strip, a location of the lead frame in the lead frame strip, data from the first test, and data from the second test.

13. The system of claim 12, further comprising means for generating a wafer map using a data structure, the wafer map specifies areas of the wafer with one or more defects.

14. The system of claim 12, wherein the lead frame strip comprises multiple instances of a scannable bar code, and wherein the data structure is populated with the identifier of the lead frame strip using the scannable bar code.

15. The system of claim 12, wherein the means for cross-referencing an identifier of the wafer comprises a lot number of the wafer and a lot number of the lead frame strip.

16. The system of claim 12, wherein means for cross-referencing an identifier of the wafer cross-references the identifier of the lead frame strip and the location of the lead frame in the lead frame strip with an identifier of another wafer from which another die is produced, the another die attached to the lead frame and housed within the package.

17. A semiconductor device manufactured pursuant to the following process, comprising:
    performing a test on a die from a singulated semiconductor wafer;
    determining that the die passes the test;
    populating a data structure with an identifier of the wafer and a location of the die in the wafer;
    as a result of the determination that the die passes the test, removing the die from the wafer and attaching the die to a lead frame, the lead frame part of a lead frame strip; and
    populating the data structure with an identifier of the lead frame strip and a location of the lead frame in the lead frame strip,
    wherein the data structure cross-references the identifier of the wafer and the location of the die in the wafer with the identifier of the lead frame strip and the location of the lead frame in the lead frame strip.

18. The semiconductor device of claim 17, further comprising performing the test using a parameter and populating the data structure with the parameter.

19. The semiconductor device of claim 18, further comprising performing a second test using the parameter in the data structure.

20. The semiconductor device of claim 19, further comprising generating a wafer map using results of at least one of the first and second tests, the wafer map indicates defects in the wafer.

21. The semiconductor device of claim 17, further comprising populating the data structure with a lot number of the wafer.

22. The semiconductor device of claim 17, further comprising populating the data structure with a lot number of the lead frame strip.

23. The semiconductor device of claim 17, wherein the identifier of the lead frame strip comprises a scannable bar code.

24. The semiconductor device of claim 17, wherein each of the location of the die ire the wafer and the location of the lead frame in the lead frame strip is specified using coordinates.

25. The semiconductor device of claim 17, wherein the data structure cross-references the identifier of the lead frame strip with an identifier of another wafer and a location of another die in the another wafer, the another die coupled to the lead frame.

26. The semiconductor device of claim 17, further comprising populating the data structure with defect data associated with packaging the lead frame.

* * * * *